United States Patent [19]
Honma et al.

[11] Patent Number: 5,237,268
[45] Date of Patent: Aug. 17, 1993

[54] FILM CARRIER STRUCTURE CAPABLE OF SIMPLIFYING TEST

[75] Inventors: Ryoji Honma; Soichi Kawasaki, both of Tokyo; Hidetaka Tone, Yokosuka; Hiroyuki Ohira; Kouichi Watanabe, both of Kawasaki, all of Japan

[73] Assignee: Kabushiki Kaisha Toshiba, Kawasaki, Japan

[21] Appl. No.: 742,426

[22] Filed: Aug. 7, 1991

[30] Foreign Application Priority Data

Aug. 13, 1990 [JP] Japan .................. 2-214149

[51] Int. Cl.$^5$ .................................................. G01R 1/02
[52] U.S. Cl. ................................ 324/158 P; 324/158 F
[58] Field of Search ............... 324/158 F, 158 P, 72.5; 174/52.2, 52.4, 260, 255; 357/80, 71; 361/400, 401; 29/840

[56] References Cited

U.S. PATENT DOCUMENTS

| | | | |
|---|---|---|---|
| 3,493,858 | 2/1970 | Baron et al. | 324/158 P |
| 3,838,984 | 10/1974 | Crane et al. | 174/52.2 |
| 4,380,805 | 4/1983 | Proebsting | 324/158 T |
| 4,386,389 | 5/1983 | Proebsting | 174/52.2 |
| 4,705,606 | 11/1987 | Young et al. | 357/80 |
| 4,808,769 | 2/1989 | Nakano et al. | 174/255 |

*Primary Examiner*—Vinh Nguyen
*Attorney, Agent, or Firm*—Finnegan, Henderson, Farabow, Garrett & Dunner

[57] ABSTRACT

A plurality of semiconductor integrated circuit devices are mounted on a film carrier. First electrical connecting sections and first electrical wiring sections for electrically connecting the first electrical connecting sections to the semiconductor integrated circuit devices are provided on the film carrier. Second and third electrical connecting sections and second electrical wiring sections are provided on a film-like probe for electrical characteristic test. The second electrical connecting sections are provided in position corresponding to the first electrical connecting sections of the film carrier. The third electrical connecting sections are used to supply electrical signals to the exterior or derive an electrical signal to the exterior and check the electrical signal. The second electrical wiring sections connects the second and third electrical connecting sections to each other. The film-like probe and the film carrier are superposed on each other so as to set the second electrical connecting sections of the filmlike probe into contact with the first electrical connecting sections of the film carrier.

6 Claims, 5 Drawing Sheets

FILM CARRIER STRUCTURE CAPABLE OF SIMPLIFYING TEST

BACKGROUND OF THE INVENTION

1. Field of the Invention

This invention relates to a semiconductor integrated circuit device of film carrier system (or TAB), and more particularly to a film carrier structure capable of simplifying the electrical characteristic test of a semiconductor integrated circuit device.

2. Description of the Related Art

In a film carrier system, a semiconductor integrated circuit device (chip) is mounted on a film carrier (TAB tape). A group of terminals for effecting the electrical characteristic test are provided for each chip on the film carrier and inner leads bonded on the bonding pad of the chip are connected to the group of terminals. Sprocket holes are formed in both sides of the film carrier and used for tape feed in the automatic bonding operation.

The electrical characteristic tests such as the function checking test and current conducting test for detecting the initial defects called Burn-In are effected with respect to the semiconductor integrated circuit device mounted on the film carrier. The Burn-In in the semiconductor integrated circuit device of film carrier system is described in U.S. Pat. No. 4,380,805, U.S. Pat. No. 4,386,389 and the like, for example.

The electrical characteristic test in this type of semiconductor integrated circuit device is generally effected in the following methods (A) and (B).

(A) First, the film carrier is wound around a cylindrical fixed portion provided in a Burn-In tester. Next, a probe connected to the Burn-In tester is brought into contact with the group of terminals for effecting the electrical characteristic test of each semiconductor integrated circuit device to supply electrical signals such as a clock signal and a power source voltage. Then, the Burn-In is effected by operating the semiconductor integrated circuit device with the thermal load applied thereto. At this time, since the length of the film carrier wound around the cylindrical fixed portion of the Burn-In tester is limited, the film carrier is cut apart depending on the scale of the Burn-In tester. After the Burn-In, the cut-apart film carriers are connected together and wound around a film carrier reel. Probes of a probe card connected to an IC tester are then brought into contact with the group of terminals for the electrical characteristic test provided on each semiconductor integrated circuit device to supply a power source voltage and electrical signals so as to separately and sequentially effect the tests for the functions of the semiconductor integrated circuit devices.

(B) The film carrier is cut apart for respective semiconductor integrated circuit devices and the divide film carrier type semiconductor integrated circuit devices are attached to a system carrier. The system carrier is inserted into the socket of the Burn-In board and set into the Burn-In tester, and electrical signals such as a clock signal and a power source voltage are supplied from the Burn-In tester via the test board. Then, the Burn-In is effected by operating the semiconductor integrated circuit device with the thermal load applied thereto. The Burn-In method is preferable to cope with an increased the number of terminals which is required for a semiconductor integrated circuit device using the film carrier. After this, an electrical signal for testing is supplied from the IC tester to the semiconductor integrated circuit device via the test board (or performance board) to effect the function test.

However, in the test method as described in (A), since it is necessary to separately supply an electrical signal for testing from the Burn-In tester to the semiconductor integrated circuit device, the Burn-In tester may be made complicated in construction and the size of the Burn-In tester may be increased since the film fixing portion of the Burn-In tester is cylindrical. Further, in the process of a function checking test after the Burn-In, the cut-apart film carriers must be connected together, and therefore the operation for the test becomes complicated and the efficiency is lowered. If the probes of the probe card are mis-aligned with respect to the group of terminals for the electrical characteristic test, the test cannot be effected, so that re-tests must be effected several times, making time for the test unnecessarily longer. Further, since the function checking tests are separately effected for the respective semiconductor integrated circuit devices, the efficiency is lowered.

In the case of the test method (B), since it is necessary to cut apart a plurality of semiconductor integrated circuit devices mounted on the long film carrier and insert and fix the individual semiconductor integrated circuit device in the socket of the Burn-In board, the treatment thereof is complicated and time for the Burn-In becomes long. Further, the system carrier is necessary. Even though the semiconductor integrated circuit devices subjected to the Burn-In by use of the method (B) are mounted on the film carrier, they are subjected to the test after being divided into individual sections. Therefore, the film carrier type semiconductor integrated circuit device cannot be easily automated.

As described above, with the conventional film carrier structure, since the respective semiconductor integrated circuit devices are separately operated at the time of electrical characteristic test, the efficiency of the electrical characteristic test is low and the test time becomes long.

SUMMARY OF THE INVENTION

An object of this invention is to provide a film carrier structure permitting the electrical characteristic tests for a plurality of semiconductor integrated circuit devices to be simultaneously effected, thereby making it possible to reduce the test time, simplify the treatment thereof and enhance the efficiency of the electrical characteristic test.

The above object can be attained by a film carrier structure comprising a film carrier; semiconductor integrated circuit devices mounted on the film carrier; first electrical connecting sections formed on the film carrier; first electrical wiring sections for electrically connecting the semiconductor integrated circuit devices to the first electrical connecting sections; and a film-like probe for supplying or deriving electrical signals necessary for the electrical characteristic test of the semiconductor integrated circuit devices and checking the electrical signal, the electrical characteristic test of the semiconductor integrated circuit devices being effected with the film-like probe superposed on the film carrier.

With the above construction, since an electrical signal necessary for the electrical characteristic test is supplied to or derived from the plurality of semiconductor integrated circuit devices via the film-like probe so as to check the electrical signal, the electrical characteristic tests for the plurality of semiconductor integrated circuit devices can be simultaneously effected, thereby making it possible to reduce time for the test. Further, since it is not necessary to divide the film carrier for the respective semiconductor integrated circuit devices, the treatment thereof can be simplified. As a result, a film carrier structure capable of enhancing the efficiency of the electrical characteristic test can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1A:
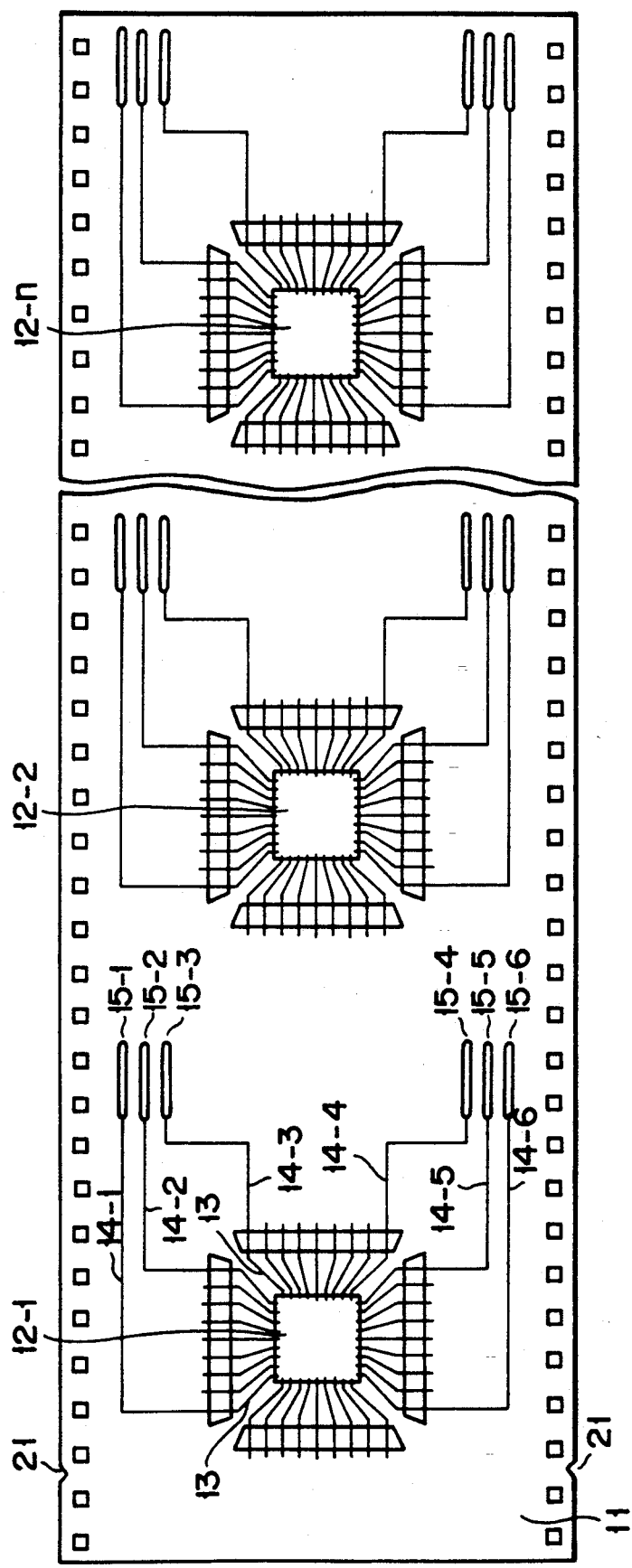
FIG. 1A is a plan view of a film carrier on which semiconductor integrated circuit devices are mounted, for illustrating a film carrier structure according to a first embodiment of this invention.
Figure 1B:
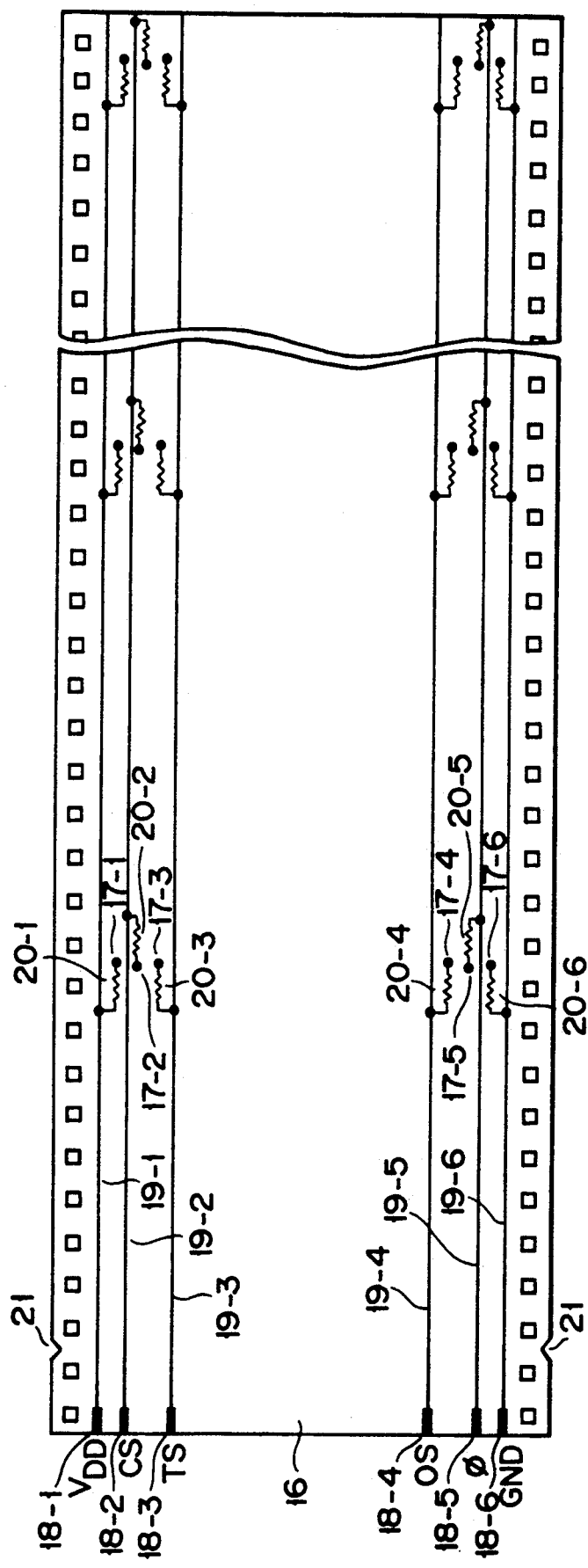
FIG. 1B a plan view of a film-like probe superimposed on the film carrier shown in FIG. 1A, for illustrating the film carrier structure according to the first embodiment of this invention.

FIG. 1A is a schematic plan view of a film carrier on which semiconductor integrated circuit devices are mounted, and FIG. 1B is a schematic plan view of a film carrier (film-like probe) used for effecting the electrical characteristic test.

A film carrier 11 shown in FIG. 1A has a plurality of (n) semiconductor integrated circuit devices 12-1, 12-2, ---, 12-n mounted thereon. Inner leads 13 of each of the semiconductor integrated circuit devices 12-1, 12-2, ---, 12-n are selectively connected to one end of first electrical wiring sections, or wirings, 14-1 to 14-6. The other ends of the wirings 14-1 to first are connected to electrical connecting sections 15-1 to 15-6, respectively, used for the electrical characteristic test and formed of conductive material such as metal or conductive rubber. For example, the first electrical connecting section 15-1 is connected to the power source $V_{DD}$ pad of the semiconductor integrated circuit device 12-1 via the first electrical wiring section 14-1 and a corresponding one of the inner leads 13, the first electrical connecting section 15-2 is connected to a signal input pad for test control via the first electrical wiring section 14-2 and a corresponding one of the inner leads 13, the first electrical connecting section, 15-3 is connected to a test signal input pad via the first electrical wiring section 14-3 and a corresponding one of the inner leads 13, the first electrical connecting section 15-4 is connected to a signal output pad for the test result via the first electrical wiring section 14-4 and a corresponding one of the inner leads 13, the first electrical connecting section 15-5 is connected to a clock signal input via the first electrical wiring section 14-5 and a corresponding one of the inner leads 13, and the first electrical connecting section 15-6 is connected to a ground GND pad via the first electrical wiring section 14-6 and a corresponding one of the inner leads 13.

Second electrical connecting sections 17-1 to 17-6 formed of conductive material such as metal or conductive rubber are provided on the main body 16 of the film-like probe shown in FIG. 1B in positions corresponding to the first electrical connecting sections 15-1 to 15-6, respectively, of the film carrier 11 for the electrical characteristic test. On the end portion of the main body 16, third electrical connecting sections 18-1 to 18-6 formed of conductive material such as metal or conductive rubber, for supplying a power source voltage, an electrical signal and the like are provided, and the second electrical connecting sections 17-1 to 17-6 and the third electrical connecting sections 18-1 to 18-6, respectively are connected to each other via second electrical wiring sections 19-1 to 19-6, respectively. Resistors 20-1 to 20-6 serving as electrical parts for suppressing the influence of a defective semiconductor integrated circuit device on the other semiconductor integrated circuit devices and thus providing electrical protection for the semiconductor integrated circuit devices when any one of the semiconductor integrated circuit devices 12-1, 12-2, ---, 12-n is damaged are respectively connected between the second electrical wiring sections 19-1 to 19-6, respectively, and the second electrical connecting sections 17-1 to 17-6, respectively. The third electrical connecting section 18-1 is supplied with a power source voltage $V_{DD}$, the third electrical connecting section 18-2 is supplied with a signal CS for test control, the third electrical connecting section 18-3 is supplied with a test signal TS, output signals OS of the semiconductor integrated circuit devices 12-1, 12-2, ---, 2-n are output from the third electrical connecting section 18-4, the third electrical connecting section 18-5 is supplied with a clock signal $\phi$ and a ground potential GND is applied to the third electrical connecting section 18-6.

Cutout portions 21 are formed as alignment marks in corresponding positions of the film carrier 11 and the main body 16 of the film-like probe. The electrical characteristic tests such as the Burn-In and function checking test are effected with the film carrier 11 and the main body 16 of the film-like probe aligned with and superimposed on each other by using the cutout portions 21 as the alignment references. In this case, the second electrical connecting sections 17-1 to 17-6 on the film-like probe 16 side are respectively, independently and electrically connected to the first electrical connecting sections 15-1 to 15-6 on the film carrier 11 side. In this electrical connecting step, conductive rubber members or the like may be inserted between the second electrical connecting sections 17-1 to 17-6 and the first electrical connecting sections 15-1 to 15-6.

As described above, a power source voltage $V_{DD}$, GND potential, and electrical signals CS, TS and $\phi$ supplied from the third electrical connecting sections 18-1 to 18-3, 18-5 and 18-6 can be supplied to the semiconductor integrated circuit devices 12-1, 12-2, ---, 12-$n$ by electrically connecting the second electrical connecting sections 17-1 to 17-6 and the first electrical connecting sections 15-1 to 15-6 to each other with the film carrier 11 and the film-like probe 16 superimposed on each other. Output signals of the semiconductor integrated circuit devices 12-1, 12-2, ---, 12-$n$ are output as an output signal OS from the second electrical connecting section 17-4.

Next, the electrical characteristic test (particularly, the function checking test) is explained.

The test is effected by connecting an IC tester, for example, to the third electrical connecting sections 18-1 to 18-6 and supplying a power source voltage $V_{DD}$, GND potential, and electrical signals CS, TS and $\phi$ to operate the semiconductor integrated circuit devices 12-1, 12-2, ---, 12-$n$. First, the test starting state of the semiconductor integrated circuit devices 12-1, 12-2, ---, 12-$n$ is set up by supplying the test control signal CS to the third electrical connecting section 18-2 while the power source voltage $V_{DD}$ and GND potential are applied to the third electrical connecting sections 18-1 and 18-6, respectively. At this time, an input signal TS for test is supplied from the third electrical connecting section 18-3 and a clock signal $\phi$ is supplied from the third electrical connecting section 18-5. As a result, the semiconductor integrated circuit devices 12-1, 12-2, ---, 12-$n$ are supplied with the power source voltage $V_{DD}$, GND potential, and electrical signals CS, TS and $\phi$ for test from the third electrical connecting sections 18-1 to 18-3, 18-5 and 18-6, respectively, via the second electrical wiring sections 19-1 to 19-3, 19-5 and 19-6, respectively, the resistors 20-1 to 20-3, 20-5 and 20-6, respectively the second electrical connecting sections 17-1 to 17-3, 17-5 and 17-6, respectively, the first connecting sections 15-1 to 15-3, 15-5 and 15-6, respectively, of the film carrier 11, the wirings first electrical wiring sections 14-1 to 14-3, 14-5 and 14-6, respectively and the inner leads 13, and then the semiconductor integrated circuit devices 12-1, 12-2, ---, 12-$n$ are operated. An output signal OS generated from each of the semiconductor integrated circuit devices 12-1, 12-2, ---, 12-$n$ as the result of the above operation is output to the exterior via the inner lead 13, first electrical wiring section 14-4, first electrical connecting section 15-4, second electrical connecting section 17-4 of the film-like probe 16, resistor 20-4, second electrical wiring section 19-4 and third electrical connecting section 18-4. The quality of the semiconductor integrated circuit devices 12-1, 12-2, ---, 12-$n$ is, determined by checking the signal output from the third electrical connecting section 18-4 by use of an IC tester or the like.

The above-described method is effected for the function checking test. Likewise, in the case of Burn-In, the film carrier 11 and the film-like probe 16 are superimposed on each other and set into the Burn-In tester. The power source voltage $V_{DD}$, GND potential, and electrical signals CS, TS and $\phi$ are then supplied to the semiconductor integrated circuit devices 12-1, 12-2, ---, 12-$n$ via the third electrical connecting sections 18-1 to 18-3, 18-5 and 18-6, respectively so as to operate the semiconductor integrated circuit devices 12-1, 12-2, ---, 12-$n$ under the thermal load. In this case, it is not necessary to check the output signal OS output from the third electrical connecting section 18-4.

When the electrical characteristic tests such as the Burn-In and function checking test are effected by using the film carrier structure as shown in FIG. 1A and superimposing the film-like probe as shown in FIG. 1B on the film carrier, the following effects (A) to (F) can be attained.

(A) Since the electrical characteristic tests can be effected by simultaneously operating a plurality of semiconductor integrated circuit devices, time and cost for the test can be significantly reduced.

(B) In the Burn-In process, since it is not necessary to supply a power source voltage and electrical signals to the semiconductor integrated circuit devices, and since a power source voltage and electrical signals can be supplied to a plurality of semiconductor integrated circuit devices 12-1, 12-2, ---, 12-$n$ only by supplying the power source voltage and electrical signals to the third electrical connecting sections 18-1 to 18-6 which are collectively disposed in one place, the Burn-In tester can be made simple in construction. Further, when the film carrier is inserted into the Burn-In tester, the film fixing portion is not necessarily cylindrical and it can be inserted in a desired form so that the Burn-In tester can be made smaller.

(C) In the function checking test process after the Burn-In, it is not necessary to connect the cut-apart film carriers together and there is no possibility that misalignment occurs between a group of terminals for electrical characteristic tests and the probes of the probe card. Further, it is not necessary to mount the same on the system carrier and insert the individual semiconductor integrated circuit device into the socket of the Burn-In board so that the treatment thereof can be made simple and control for complicated treatment can be alleviated. Also, in this respect, the time required for the function checking test can be reduced.

(D) Since the film-like probe has less electrical parts and is highly reliable, it can be repeatedly used. Further, the test and Burn-In for various types of semiconductor integrated circuit devices mounted on various types of film carriers can be effected by a common device. A common film-like probe can be used by standardizing positions in which the first electrical connection sections 15-1 to 15-6 on the side of the film carrier 11 having the semiconductor integrated circuit devices 12-1, 12-2, ---, 12-$n$ mounted thereon are formed and positions in which the second and third electrical connecting sections 17-1 to 17-6 and 18-1 to 18-6 on the side of the film-like probe 16 are formed.

(E) It is sufficient to control the film carrier 11 for each preset length, and the treatment thereof can be made simple if the number of the semiconductor integrated circuit devices 12-1, 12-2, ---, 12-$n$ mounted on the film carrier 11 which are tested at one time is previously determined.

(F) Since it is not necessary to use the system carrier, the cost for the system carrier can be omitted.

In the above embodiment, a single film-like probe is superimposed on the film carrier, but it is also possible to form the electrical wiring sections and electrical connecting sections on a plurality of film-like probes and superimpose the plurality of film-like probes on the film carrier. This construction is particularly advantageous when the number of the electrical wiring sections and electrical connecting sections is increased in order to effect a complicated function checking test for the semiconductor integrated circuit devices. Further, in the above embodiment, the resistors 20-1 to 20-6 are used to suppress the influence of a damaged semiconductor integrated circuit device on the other semiconductor integrated circuit devices and to protect the other semiconductor integrated circuit devices from electrical damage when any one of the semiconductor integrated circuit devices 12-1, 12-2, ---, 12-n under test is damaged. However, even if the resistors 20-1 to 20-6 are omitted, substantially the same effect can be obtained.

Figure 2A:
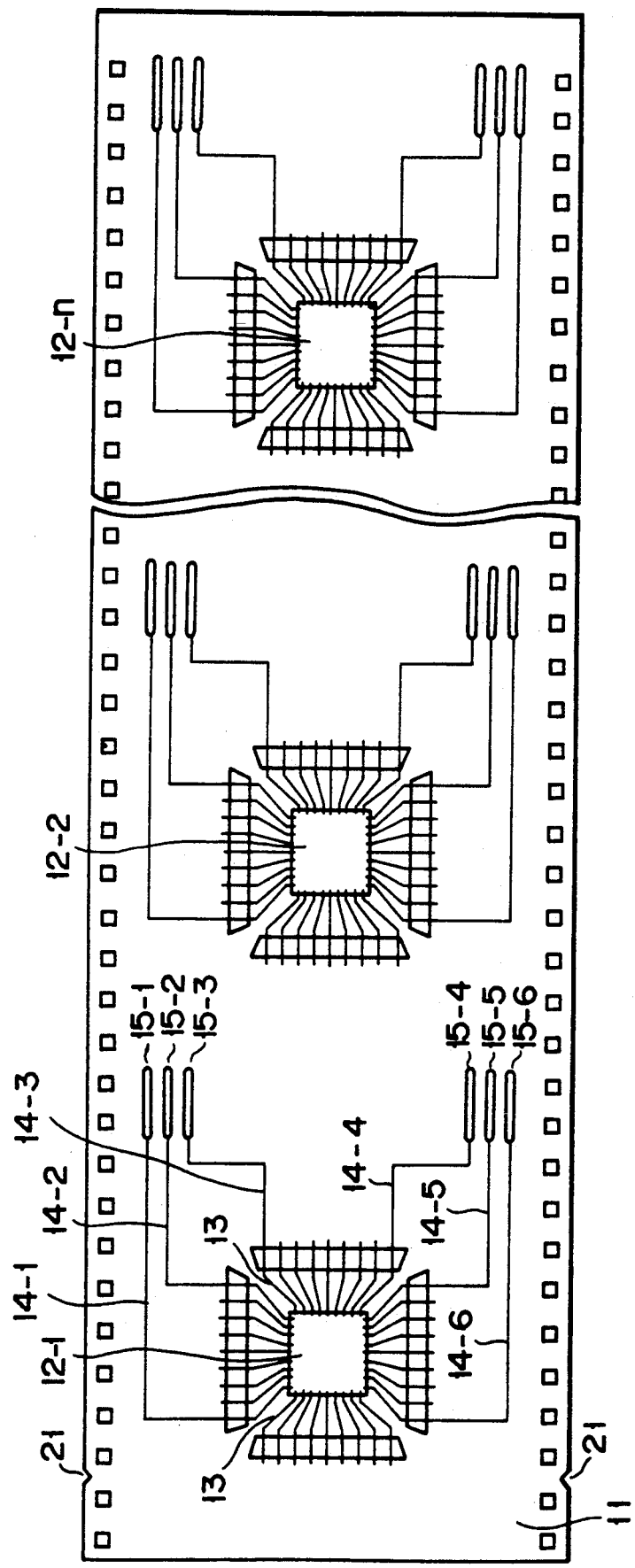
FIG. 2 is a plan view of a film carrier on which semiconductor integrated circuit devices are mounted, for illustrating a film carrier structure according to a second embodiment of this invention.
FIG. 2B a plan view of a film-like probe superimposed on the film carrier shown in FIG. 2A, for illustrating the film carrier structure according to the second embodiment of this invention.
Figure 2B:
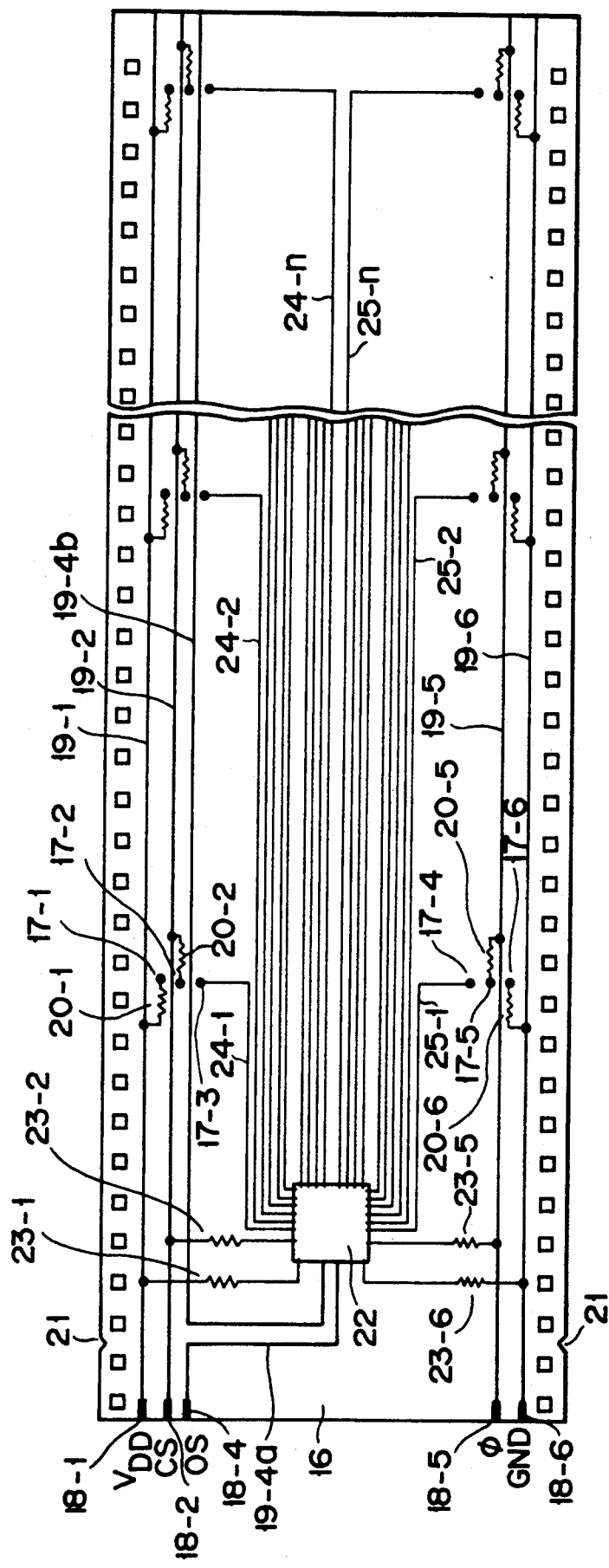

FIGS. 2A and 2B show a second embodiment of this invention in which a semiconductor integrated circuit device 22 for electrical characteristic test is mounted on the film-like probe 16 shown in FIG. 1B. In FIG. 2B, portions which are the same as those of FIG. 1B are denoted by the same reference numerals and the explanation therefor is omitted. That is, the semiconductor integrated circuit device 22 for electrical characteristic test is mounted on the film-like probe 16 and a power source pad of the device 22 is connected to a third electrical connecting section 18-1 via a resistor 23-1, a signal input pad thereof for test control is connected to a third electrical connecting section 18-2 via a resistor 23-2, a signal output pad thereof for the test result is connected to a third electrical connecting section 18-4 via a third electrical wiring section 19-4a, a clock signal input pad thereof is connected to a third electrical connecting section 18-5 via a resistor 23-5, and a ground pad thereof is connected to a third electrical connecting section 18-6 via a resistor 23-6. Test signal output pads of the semiconductor integrated circuit device 22 are connected to one-side ends of fourth electrical wiring sections 24-1 to 24-n and 25-1 to 25-n and the other ends of the fourth electrical wiring sections 24-1 to 24-n and 25-1 to 25-n are respectively connected to fourth electrical connecting sections 17-3a and 17-4a corresponding to the semiconductor integrated circuit devices 12-1, 12-2, ---, 12-n. The fourth electrical wiring sections 24-1 to 24-n and 25-1 to 25-n are respectively connected in parallel with the semiconductor integrated circuit devices 12-1, 12-2, ---, 12-n so as to permit a scan test or the like to be effected.

The test is effected with the film-like probe 16 superposed on the film carrier 11 shown in FIG. 2A. In this case, the semiconductor integrated circuit devices 12,1 12-2, ---, 12-n are supplied with a power source voltage $V_{DD}$, GND potential, and electrical signals CS, TS and $\phi$ from the exterior and a test signal from the semiconductor integrated circuit device 22. Output signals of the semiconductor integrated circuit devices 12-1, 12-2, ---, 12-n derived by the test operation are received by the semiconductor integrated circuit device 22. After this, the test result stored in the semiconductor integrated circuit device 22 is output from the third electrical connecting section 18-4 to the exterior via third electrical wiring section 19-4a and the function checking test for the semiconductor integrated circuit devices 12-1, 12-2, ---, 12-n is completed.

A fifth electrical wiring section 19-4b in FIG. 2B is a signal line connected to another semiconductor integrated circuit device (not shown) for the electrical characteristic test, and for example, it is used to make an electrical connection between a plurality of semiconductor integrated circuit devices for the electrical characteristic test when the semiconductor integrated circuit devices are mounted on the film-like probe 16. That is, in a case where a single semiconductor integrated circuit device 22 for the electrical characteristic test is provided for a preset number of semiconductor integrated circuit devices 12 to make one block and a plurality of such blocks are provided, the semiconductor integrated circuit devices for the electrical characteristic test are series-connected via the fifth electrical wiring section 19-4b so as to output the test result to the exterior.

Like the case of the function checking test, in the case of Burn-In, the semiconductor integrated circuit devices 12-1, 12-2, ---, 12-n under thermal load are operated under the control of the semiconductor integrated circuit device 22 and the output signal may be disregarded.

With the above construction, since the semiconductor integrated circuit devices 12-1, 12-2, ---, 12-n can be checked or controlled by supplying test signals from the semiconductor integrated circuit device 22 mounted on the film-like probe 16 to the semiconductor integrated circuit devices 12-1, 12-2, ---, 12-n, the number of electrical signals supplied from the test device such as an IC tester may be suppressed to a minimum, and the test device can be significantly simplified in comparison with that of the former embodiment. In this case, the effects (A) to (F) can be maintained.

In the above embodiment, all of the test signals are supplied from the semiconductor integrated circuit device 22 for the electrical characteristic test to the semiconductor integrated circuit devices 12-1, 12-2, ---, 12-n, but it is possible to supply some of the test signals from the semiconductor integrated circuit device 22 for the electrical characteristic test and supply the remaining test signals from the exterior. Further, in the above embodiment, a single film-like probe is used, but like the case shown in FIGS. 1A and 1B, it is also possible to separately mount the electrical wiring sections and electrical connecting sections on a plurality of film-like probes instead of mounting them on a single film-like probe and superimpose the plurality of film-like probes on the film carrier.

Figure 3:
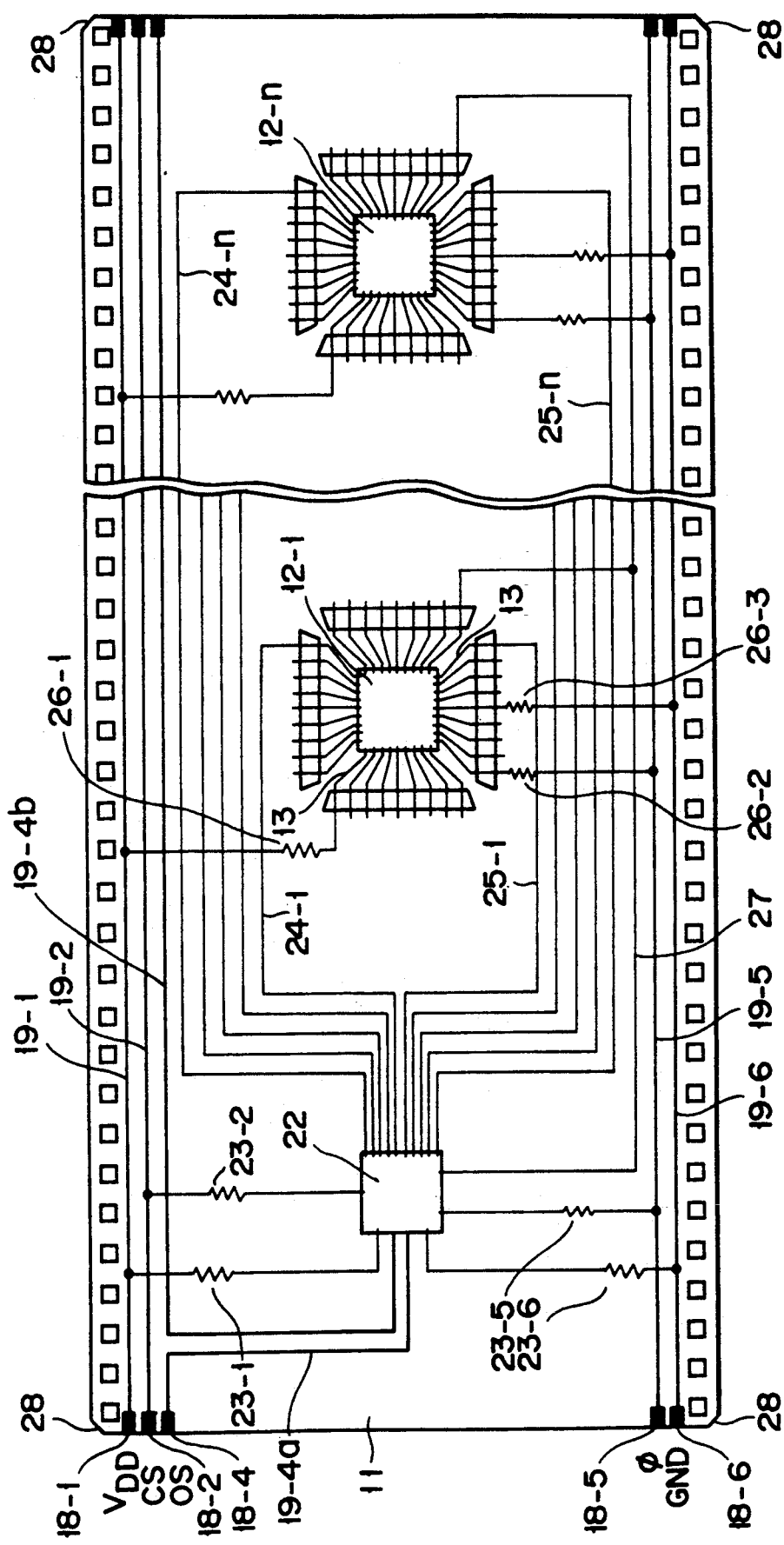
FIG. 3 is a plan view of a film carrier on which semiconductor integrated circuit devices are mounted, for illustrating a film carrier structure according to a third embodiment of this invention.

FIG. 3 shows still another embodiment of this invention in which a semiconductor integrated circuit device 22 for the electrical characteristic test shown in FIG. 2A is mounted on a film carrier 11. In other words, the above structure is obtained by incorporating the structure of the film-like probe 16 shown in FIG. 2B into the structure of the film carrier 11 shown in FIG. 1A or 2A. In FIG. 3, portions which are the same as those of FIGS. 2A and 2B are denoted by the same reference numerals and the explanation thereof is omitted.

When the above film carrier structure is tested, a power source voltage $V_{DD}$, GND potential, and electrical signals CS and $\phi$ are directly supplied to electrical connecting sections 18-1, 18-2 and 18-4 to 18-6, respectively provided on the film carrier without superimposing the film carrier and the film-like probe on each other as in the former embodiments. That is, the semiconductor integrated circuit device 22 for the electrical characteristic test mounted on the film carrier 11 is supplied with the power source voltage $V_{DD}$, GND potential, test control signal CS for starting the test and a clock signal $\phi$ from a test device such as an IC tester via the electrical connecting sections 18-1, 18-2, 18-4, 18-5 and 18-6, respectively first electrical wiring sections 19-1, 19-2, 19-4a, 19-5, respectively and 19-6, respectively and resistors 23-1, 23-2, 23-5 and 23-6. The semiconductor integrated circuit devices 12-1 to 12-n are supplied with the power source voltage $V_{DD}$, GND potential and a clock signal φ via the electrical connecting sections 18-1, 18-5 and 18-6, respectively first wiring sections 19-1, 19-5 and 19-6, respectively and resistors 26-1 to 26-3, respectively. Further, test signals are supplied from the semiconductor integrated circuit device 22 to the semiconductor integrated circuit devices 12-1 to 12-n via the second electrical wiring sections 24-1 to 24-n and 25-1 to 25-n, respectively, and a test control signal is supplied from the semiconductor integrated circuit device 22 to the semiconductor integrated circuit devices 12-1 to 12-n via an electrical wiring 27. The resistors 26-1 to 26-3 are used to suppress the influence of a defective semiconductor integrated circuit device on the other semiconductor integrated circuit devices, and thus providing electrical protection for the semiconductor integrated circuit devices when any one of the semiconductor integrated circuit devices 12-1 to 12-n is damaged. Output signals of the semiconductor integrated circuit devices 12-1 to 12-n are received by the semiconductor integrated circuit device 22. An output signal OS of the semiconductor integrated circuit device 22 is output to the exterior via the first electrical wiring 19-4a and electrical connecting section, 18-4.

In FIG. 3, a third electrical wiring section 19-4b is connected to another semiconductor integrated circuit device (not shown) for the electrical characteristic test, and when a plurality of semiconductor integrated circuit devices for the electrical characteristic test are mounted on the film carrier 11, it is used to connect the semiconductor integrated circuit devices to each other. In a case where each semiconductor integrated circuit device 22 for the electrical characteristic test is provided for a preset number of semiconductor integrated circuit devices 12 to make one block and a plurality of such blocks are provided, the semiconductor integrated circuit devices for the electrical characteristic test are series-connected via the third electrical wiring section 19-4b so as to output the test result to the exterior. Cutout portions 28 formed on the four corners of the film carrier 11 represent the boundary of one block and formed to correspond to the electrical connecting sections 18 of a long continuous film carrier, and if the film carrier is cut apart at this portion, the electrical connecting sections 18 can be easily placed on the end portion of the film carrier 11.

With this structure, since test signals can be supplied from the semiconductor integrated circuit device 22 mounted on the film carrier 11 to the semiconductor integrated circuit devices 12-1, 12-2, ---, 12-n, the number of electrical signals supplied from the test device such as an IC tester may be suppressed to a minimum, and the test device can be significantly simplified as in the embodiment shown in FIGS. 2A and 2B Like the case of the function checking test, in the case of Burn-In, the semiconductor integrated circuit devices 12-1, 12-2, ---, 12-n under thermal load are operated under the control of the semiconductor integrated circuit device 22, and the output signal may be disregarded.

In the embodiment of FIG. 3, when the semiconductor integrated circuit devices 12-1, 12-2, ---, 12-n are sealed into a package, only the devices 12-1 to 12-n are cut apart from the film carrier 11 and used, and the semiconductor integrated circuit device 22 for electrical characteristic test is discarded. However, since the function checking device (IC tester) and Burn-In tester can be made simple in construction by using the above film carrier structure, use and discarding of the semiconductor integrated circuit device 22 may sufficiently pay for itself in other cost savings if an inexpensive semiconductor integrated circuit device is used.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

As described above, according to this invention, a film carrier structure can be provided in which the electrical characteristic tests for a plurality of semiconductor integrated circuit devices can be simultaneously effected, time for the test can be reduced, the treatment thereof can be simplified and the efficiency of the electrical characteristic test can be enhanced.

What is claimed is:

1. A system for performing an electrical characteristic test of a plurality of semiconductor integrated circuit devices comprising:

a film carrier on which the plurality of semiconductor integrated circuit devices are mounted;

a plurality of groups of first electrical connecting sections formed on said film carrier, each group of first electrical connecting sections corresponding to one of the semiconductor integrated circuit devices;

a plurality of groups of first electrical wiring sections formed on said film carrier, each group of first electrical wiring sections electrically connecting one of the semiconductor integrated circuit devices to the corresponding group of first electrical connecting sections;

a film-like probe for supplying and deriving electrical signals necessary for the electrical characteristic test, said film-like probe including a film;

a plurality of groups of second electrical connecting sections formed on the film-like probe, each group of second electrical connecting sections opposing a corresponding group of first electrical connecting sections on the film carrier when the film-like probe and film carrier are superimposed;

a single group of third electrical connecting sections formed on the film-like probe for supplying or deriving electrical signals to or from the film-like probe; and a single group of second electrical wiring sections formed on said film-like probe for electrically connecting each group of second electrical connecting sections to the third electrical connecting sections, each second electrical wiring section electrically connecting one of the third electrical connecting sections to a plurality of the second electrical connecting sections;

wherein the film-like probe is superimposed on the film carrier so as to bring each group of second electrical connecting sections of the film-like probe into contact with the corresponding group of first electrical connecting sections of the film carrier, thus effecting the electrical characteristic test of the semiconductor integrated circuit devices.

2. A system according to claim 1, wherein an electrical signal for the electrical characteristic test is supplied from outside of the film-like probe to at least one of the third electrical connecting sections, and an electric signal output from at least one of the remaining third electrical connecting sections is checked, thereby effecting the electrical characteristic test.

3. A system according to claim 1, further comprising a plurality of electrical parts formed on the film-like probe, each second electrical wiring section being electrically connected to an electrical part disposed between that second electrical wiring section and the corresponding second electrical connecting section.

4. A system according to claim 3, wherein each of said electrical parts includes a resistor.

5. A system according to claim 1, further comprising alignment marks formed in corresponding positions on said film carrier and said film-like probe.

6. A system according to claim 5, wherein said alignment marks include cutout portions.

* * * * *

UNITED STATES PATENT AND TRADEMARK OFFICE
CERTIFICATE OF CORRECTION

PATENT NO. : 5,237,268
DATED : August 17, 1993
INVENTOR(S) : Ryoji Honma et al.

It is certified that error appears in the above-indentified patent and that said Letters Patent is hereby corrected as shown below:

On title page, item [56], "Reference Cited", between
second occurence of "Proebsting" and "Young et al."
insert --4,701,781  10/1987  Sankhagowit ......257/671--.

Signed and Sealed this

Twentieth Day of December, 1994

Attest:

BRUCE LEHMAN

Attesting Officer     Commissioner of Patents and Trademarks